(12) United States Patent
Yoshida

(10) Patent No.: US 7,479,051 B2
(45) Date of Patent: Jan. 20, 2009

(54) ORGANIC EL PANEL AND A METHOD OF PRODUCING THE SAME

(75) Inventor: Ayako Yoshida, Tsurugashima (JP)

(73) Assignee: Pioneeer Corporation, Tokyo-to (JP)

( * ) Notice: Subject to any disclaimer, the term of this patent is extended or adjusted under 35 U.S.C. 154(b) by 543 days.

(21) Appl. No.: 11/234,205

(22) Filed: Sep. 26, 2005

(65) Prior Publication Data

US 2006/0066222 A1 Mar. 30, 2006

(30) Foreign Application Priority Data

Sep. 27, 2004 (JP) ............................ P2004-279678

(51) Int. Cl.
*H01J 9/26* (2006.01)
*H01J 9/32* (2006.01)
(52) U.S. Cl. .............................. 445/25; 445/24; 427/66
(58) Field of Classification Search ............. 445/24–25; 427/66; 430/11
See application file for complete search history.

(56) References Cited

U.S. PATENT DOCUMENTS

2007/0275254 A1* 11/2007 Nagata ........................ 428/447

* cited by examiner

*Primary Examiner*—Mariceli Santiago
*Assistant Examiner*—Jose M Diaz
(74) *Attorney, Agent, or Firm*—Drinker Biddle & Reath LLP

(57) ABSTRACT

There is provided an organic EL panel which is obtained by sequentially laminating a first electrode, an organic material layer and a second electrode on a substrate and selectively providing a light emitting portion, being a portion of emitting light, in the organic material layer, wherein the organic material layer is heated at a position other than the light emitting portion with a heating member having a deformable heating portion to change an optical characteristic of the position while avoiding deterioration of the first electrode, the second electrode and the substrate.

8 Claims, 3 Drawing Sheets

HEATING

HEATING

HEATING

ORGANIC EL PANEL AND A METHOD OF PRODUCING THE SAME

BACKGROUND OF THE INVENTION

1. Field of the Invention

The present invention relates to a technical field of an organic EL panel used for a display device such as a display monitor and a method of producing the organic EL panel.

2. Related Art

In a conventional technique, an organic electro luminescence (EL) panel is known as a panel used for a display device such as a display monitor. This organic EL panel has a transparent substrate and an organic luminescent layer, which is sandwiched between an anode and a cathode and positioned above the transparent substrate. In the organic luminescent layer, a hole injected from the anode and an electron injected from the cathode recombine to thereby excite organic molecules for emitting light. This organic luminescent layer is formed to emit light only from a light emitting portion which corresponds to a design such as a character and a graphic for displaying the design.

As a patterning method of the light emitting portion of the design, a method (a) of providing an insulating layer or a layer which extremely break a balance of injecting holes and electrons between the electrodes at positions corresponding to other than the light emitting portions is known. Further, as another method of patterning the light emitting portions, a method (b) of providing any one of an anode and the cathode, which sandwich the organic luminescent layer, only at positions corresponding to the light emitting portions is known. Further, as another patterning method of the light emitting portions, a method (c) of applying a mask, which is made of, for example, a metal plate with portions corresponding to the light emitting portions punched out and is heated to have a high temperature, to an organic EL panel having an organic luminescent layer all over an anode, to thereby degenerate an organic composition forming parts other than the light emitting portions of the organic luminescent layer is known.

However, according to the above patterning methods (a) and (b), since all layers are patterned, there is a problem that processes of applying a resist on to the layers and exposing the layers to light are necessary and therefore extensive labor is required. Further, according to the above patterning methods (a), (b) and (c), when it is required to obtain an organic EL panel having a plurality of light emitting modes, masks corresponding to each of the patterns are necessary. In order to form such a mask, there are problems that additional labor is required and a cost for producing the organic EL panel increases.

SUMMARY OF THE INVENTION

It is therefore an object of the present invention to solve the problems inherent in the above-mentioned related arts and to provide an organic EL panel and a method of producing the EL panel, which reduce labor and cost at a time of changing a pattern of emitting light.

According to a first aspect of the invention, there is provided an organic EL panel having a first electrode, an organic material, and a second electrode, which are laminated on a substrate, the organic EL panel emitting light from the organic material by applying electricity through the first electrode and the second electrode, wherein a temperature of changing an optical characteristic of at least one of the first electrode and the second electrode is higher than a temperature of changing an optical characteristic of the organic material.

According to a second aspect of the invention, there is provided an organic EL panel according to the preceding aspect, wherein the temperatures of changing the optical characteristics are respectively a glass transition temperature.

According to a third aspect of the invention, there is provided an organic EL panel according to the preceding aspect, wherein the organic material is constituted by a plurality of materials, and the temperature of changing the optical characteristic of the organic material is a temperature of changing an optical characteristic of any one of the constitutional materials of the organic material.

According to a fourth aspect of the invention, there is provided an organic EL panel according to the preceding aspect, wherein a temperature of changing an optical characteristic of the substrate is higher than the temperature of changing the optical characteristic of the organic material.

According to a fifth aspect of the invention, there is provided an organic EL panel according to the preceding aspect, wherein the temperatures of changing the optical characteristics are respectively a glass transition temperature.

According to a sixth aspect of the invention, there is provided an organic EL panel according to the preceding aspect, wherein the organic material is constituted by a plurality of materials, and the temperature of changing the optical characteristic of the organic material is a temperature of changing an optical characteristic of any one of the constitutional materials of the organic material.

According to a seventh aspect of the invention, there is provided an organic EL panel according to the preceding aspect, further comprising: a protective layer covering at least the organic layer and any one of the first and second electrodes.

According to an eighth aspect of the invention, there is provided an organic EL panel according to the preceding aspect, further comprising:

a protective layer covering at least the organic layer and any one of the first and second electrodes.

According to a ninth aspect of the invention, there is provided an organic EL panel according to the preceding aspect, wherein a position where a light emitting amount is decreased is selectively provided in the organic material.

According to a tenth aspect of the invention, there is provided an organic EL panel according to the preceding aspect, wherein a position where a light emitting amount is decreased is selectively provided in the organic material.

According to an eleventh aspect of the invention, there is provided a method of producing an organic EL panel which is obtained by sequentially laminating a first electrode, an organic material layer, and a second electrode on a substrate and selectively providing a light emitting portion, being a portion of emitting light, in the organic material layer including steps of: heating the organic material layer at a position other than the light emitting portion with a heating member having a deformable heating portion to change an optical characteristic of the position.

According to a twelfth aspect of the invention, there is provided a method of producing an organic EL panel according to the preceding aspect, wherein the heating member is a printer having a thermal head.

According to a thirteenth aspect of the invention, there is provided a method of producing an organic EL panel according to the preceding aspect, wherein the heating member has at least a tip end which emits heat and can be gripped.

According to a fourteenth aspect of the invention, there is provided a method of producing an organic EL panel according to the preceding aspect, wherein the first electrode, the organic electrode, and the second electrode are formed irrespective of the position of the light emitting portion.

According to a fifteenth aspect of the invention, there is provided a method of producing an organic EL panel according to the preceding aspect, wherein the heating member applies heat having a temperature higher than a temperature of changing an optical characteristic of the material having the lowest temperature of changing an optical characteristic among materials which forms the organic material layer.

According to a sixteenth aspect of the invention, there is provided a method of producing an organic EL panel according to the preceding aspect, wherein the heating member heats the substrate to be lower than a temperature of changing an optical characteristic of the substrate.

According to a seventeenth aspect of the invention, there is provided a method of producing an organic EL panel according to the preceding aspect, wherein heat is applied from a side of the substrate of the organic material layer.

According to an eighteenth aspect of the invention, there is provided a method of producing an organic EL panel according to the preceding aspect, further comprising steps of:

forming a protective layer which covers at least the organic material layer and the first or second layer; and heating on a side on a side of the protective layer of the organic material layer.

DESCRIPTION OF THE PREFERRED EMBODIMENTS

Figure 1:
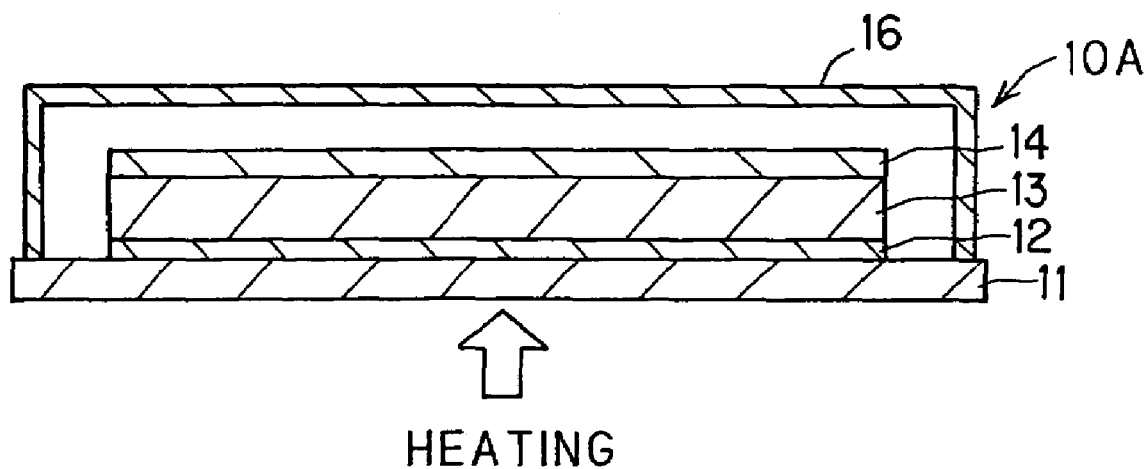
FIG. 1 is a cross-sectional view of an organic EL panel in a process of producing the EL panel according to an Embodiment of the present invention.

Preferred embodiments of the present invention will be described in conjunction with Figures. Hereinafter, each meaning of the reference numbers in the drawings is as follows: 10A, 10B: ORGANIC EL PANEL UNDER PRODUCTION; 10X: ORGANIC EL PANEL AFTER PRODUCTION; 11: TRANSPARENT SUBSTRATE; 12: FIRST ELECTRODE; 13: ORGANIC MATERIAL LAYER; 14: SECOND ELECTRODE; 15: PROTECTIVE LAYER; 16: SEALING CAN; 31: LIGHT EMITTING PORTION; 32, 32a, 32b: PART OTHER THAN LIGHT EMITTING PORTION; PC: PERSONAL COMPUTER; PR: PRINTER; TH: THERMAL HEAD; and PN: THERMAL PEN.

First, a method of producing an organic EL panel according to the embodiment will be specifically described.

Figure 2:
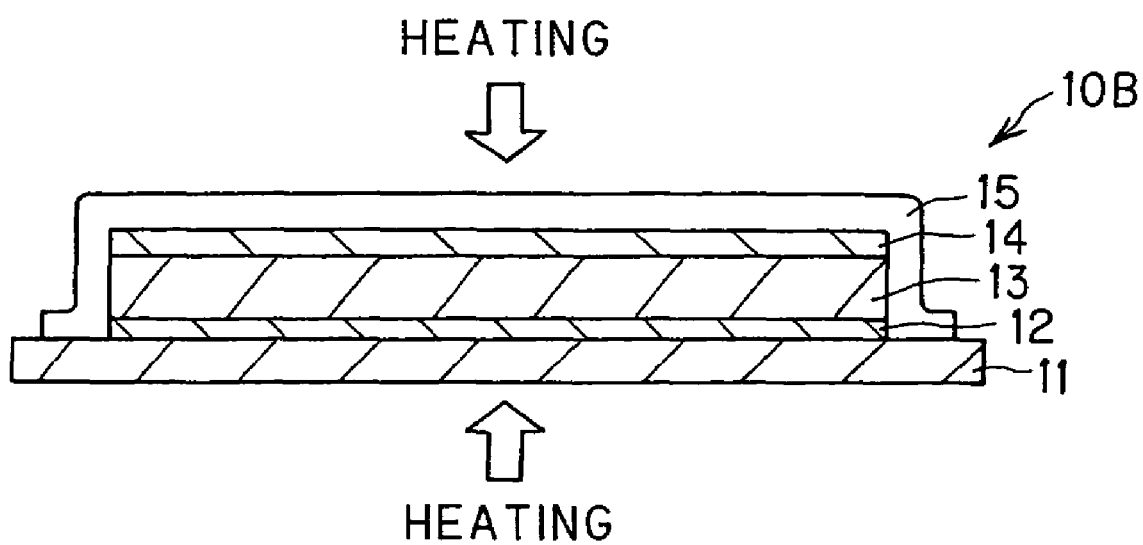
FIG. 2 is a cross-sectional view of another organic EL panel in a process of producing the EL panel according to another Embodiment of the present invention.
Figure 3:
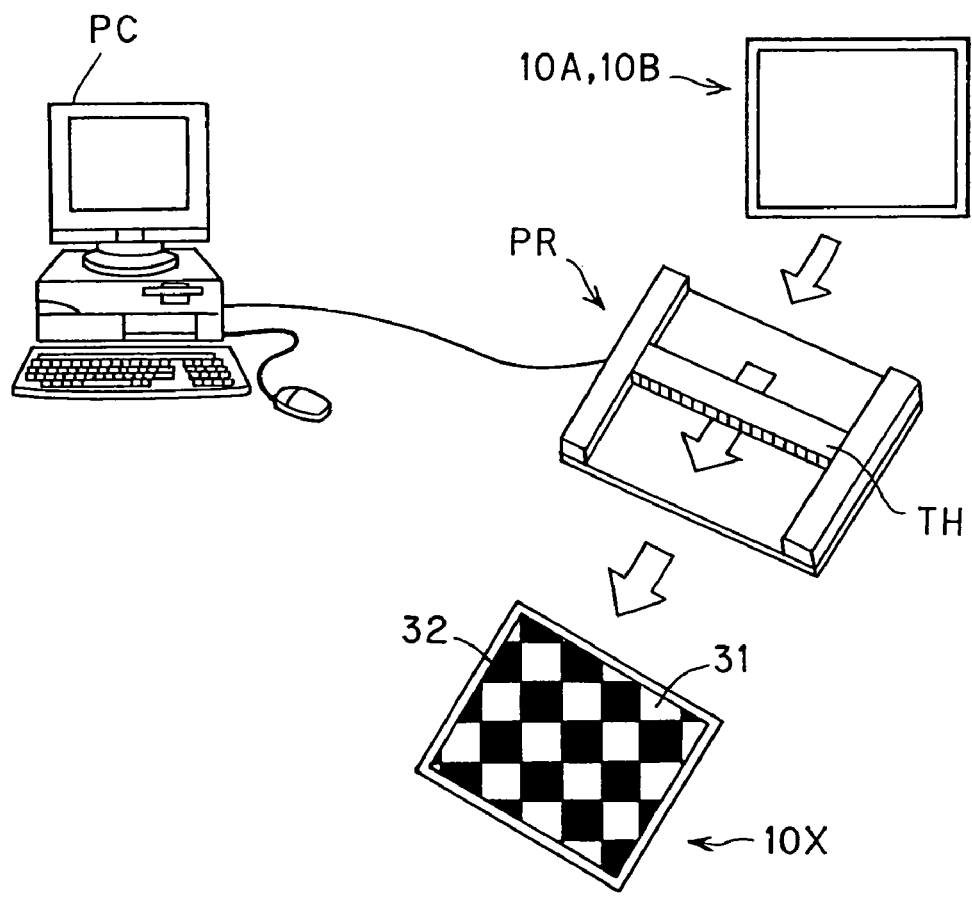
FIG. 3 schematically shows a process using a printer having a thermal head in a production method of an organic EL panel according to the Embodiment of the present invention.
Figure 4:
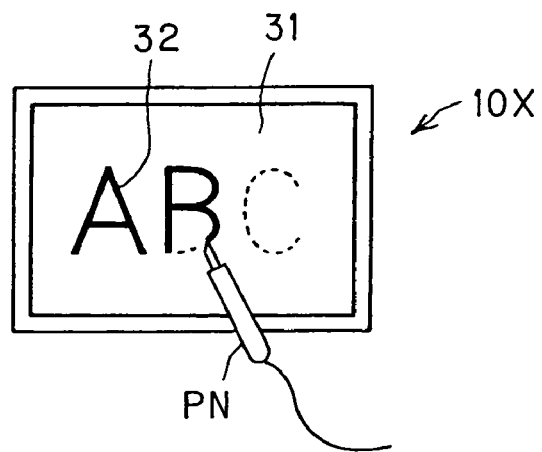
FIG. 4 schematically shows a process using a thermal pen in a production method of an organic EL panel according to the Embodiment of the present invention.
Figure 5:
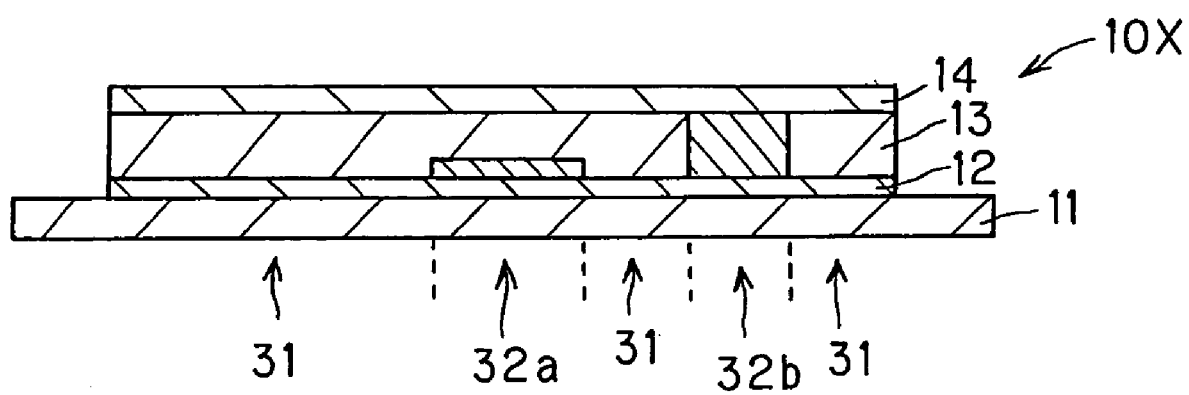
FIG. 5 is a cross-sectional view of the organic EL panel after producing the EL panel according to the Embodiment of the present invention.

Meanwhile, FIG. 1 is a cross-sectional view of an organic EL panel in a process of producing the EL panel according to an Embodiment of the present invention; and FIG. 2 is a cross-sectional view of another organic EL panel in a process of producing the EL panel according to another Embodiment of the present invention. Further, FIG. 3 schematically shows a process using a printer having a thermal head in a production method of an organic EL panel, and FIG. 4 schematically shows a process using a thermal pen in a production method of an organic EL panel. FIG. 5 is a cross-sectional view of the organic EL panel after producing the EL panel according to the Embodiment of the present invention.

As illustrated in FIGS. 1 to 5, the method of producing the organic EL panel according to the present invention is characterized that, in the production method of the organic EL panel 100X by sequentially laminating a first electrode 12, an organic material layer 13, and a second electrode 14 on a transparent material layer 11 as a substrate and selectively providing a light emitting portion 31, being a portion for emitting light onto the organic material layer 13, a position 32 other than the light emitting portions 32 on the organic material layer 13 is heated by a heating member which has a deformable heating portion.

The organic EL panel 10A in the production method according to the present embodiment is ordinarily formed, as shown in FIG. 1, by sequentially laminating the transparent material layer 11, the first electrode 12, the organic material layer 13, and the second electrode 14, and the organic layer 13 and the second electrode 14 are sealed a sealing can 16 for sealing to prevent moisture and oxygen. Further, the organic EL panel 10B in a process of producing according to another embodiment is, as shown in FIG. 2, the organic material layer 12 and the second electrode 14 are covered by a protective layer 15. Further, another arbitrary layer may be formed in the organic EL panel when necessary.

First, an entire structure of the organic EL panels 10A and 10B is described.

The transparent substrate 11 is ordinarily a flat and rectangular glass or transparent resin. This glass or the transparent resin is ordinarily what used for a transparent substrate of an organic EL panel and the material thereof is not limited. However, when the organic material layer is heated on the side of the transparent substrate 11 as described below, it is preferable to use a material having good heat conductivity. The glass is, for example, soda-lime glass, barium/strontium containing glass, lead glass, aluminosilicate glass, borosilicate glass, barium borosilicate glass, and quartz. The transparent resin is, for example, polycarbonate, methyl methacrylate resin, polyethylene terephthalate, polyethylene-2,6-naphtahalate, polysulphone, polyethersulphone, polyether, polyphenoxyether, polyarylate, fluoroplastic, polypropylene, cyclo olefin polymer, and cellulose triacetate.

The first electrode 12 is ordinarily an anode. It is preferable to use a transparent material to take out light from the organic material layer 13. The material of the first electrode 12 is not specifically limited. However, a material having large work function is preferably used. The material is, for example, aluminum, nickel, palladium, silver, iridium, platinum, and gold, and further an alloy thereof is also preferable. An electrode made from metal oxide such as tin oxide, indium oxide, indium tin oxide (ITO), antimony tin oxide (ATO), indium zinc oxide (IZO), and aluminium zinc oxide (AZO), selenium, tellurium, copper iodide, carbon black, and conductive polymers such as polyacetylene, polypyrrole, polyaniline, polythiophene, and polyphenylene may be used. The first electrode 12 may be formed to have a two-layer structure when necessary.

The organic layer 13 is ordinarily made up of a hole transport layer, an organic luminescent layer and an electron transport layer, and formed to emit light so that a hole transported from the first electrode 12 and the electron transported from the second electron 14 described below are recombined to generate light. Meanwhile, the organic material layer 13 is made up of only the organic luminescent layer, the hole transport layer and the organic luminescent layer, or the organic layer and the electron transport layer. Besides, the organic material layer 13 may have a layer such as the hole injection layer and the electron injection layer.

A construction material of the hole transport layer is preferably a chemical composition which enables effective injection from the first electrode 12, has a capability of transporting holes, has an excellent hole injection effect with respect to the organic luminescent layer or the organic material inside the organic luminescent layer, and can be formed to be a thin layer.

The material is not specifically limited. For example,
α-NPB, PVK (poly(N-vinyl carbazole)),
triphenylamine derivative TPAC
(1,1-Bis[4-[N,N-di(p-tolyl)amino]phenyl]cyclohexane)
STB, PDA, diamine derivative TPD
(N,N'-diphenyl-N,N'-(3-methylphenyl)),
diamine derivative, CuPc(Phthalocyanine Copper), and MTDATA are specifically mentioned. Further, a material of amine series, a material of hydrazone series, a material of stilbene series, and a material of Starburst series are mentioned.

A construction material of the organic luminescent layer is a material which has an excellent capability of forming a thin layer, enables efficient recombination of holes and electrons, injected from the electrodes, the hole transport layer and the electron transport layer, in the thin layer state and excitation caused by an energy which is generated at the time of the recombination, and has a high luminescent intensity of emitting energy in returning from an excited state to a ground state.

A construction material of the organic luminescent layer is not specifically limited. For example, a low molecular luminescent material such as DPVBi, EM2, PESB, Spiro-TAD, $Zn(BOX)_2$, Spiro-8φ, bis(benzoquinolinolato)beryllium complex $Bebq_2$, aluminum complex $Alq_3$(tris(8-quinolinolato)aluminum), $Tb(acac)_3$, Rubrene, $Eu(TTFA)_3Phen$, DCM, and BPPC; a high molecular luminescent material such as PPV (poly-(p-phenylenevinylene)), ROPPV(poly-(2, 5-dialkylphenylenevinylene)), MEHP, PV(2-methoxy,5-(2'-ethylhexoxy)-1,4-phenylenevinylene), CNPPV, PAT(poly-(3-alkylthiophene)), PEDOT, PCHT, POPT, PDAF(poly-(9, 9'-dialkylfuruorene)), ROPPP, F—PPP, PHOnPY25, PHOnPY35, and m-LPPP; a double substituted polyacetylene material in a high molecular luminescent material such as
PAPA(poly-(alkyl,phenylacetylene)),
PDPA (poly-(di-phenylacetylene)),
PDPA-nBu, $PDPA-SiMe_3$, $PDPA-SiPh_3$, and PDPA-Ad;
a material having a triple bond in its main chain such as PDAPE, ROPPE-An, ROPPE-Py, ROPPE-Th, and PDAPB;
a material having Si introduced into its main chain such as PDSiOT, PDSiQP, SiHMFPV, SiPhPPV, and SiPhThV;
a silicone material such as PMPS, PPS, PNPS, and PBPS; and
a phosphorescent material such as $Ir(ppy)_3$, $Ir(btp)_2(acac)$, Flrpic, PtOEP, $Pt(thpy)_2$, $Eu(DBM)_3phen$, and $Eu(TTA)_3 phen$ are mentioned.

A complex material using, for example, PVK(poly(N-vinyl carbazole)) in its host of compound material,
and using, for example, diamine derivative TPB Coumarin ((3-12-benzo thiazolyl)-7(dimethylamino)coumarin) DCM-1, Quinacridone, Rubrene, and TPP in its dopant of compound material is also mentioned.

As for a construction material of the electron transport layer, a chemical compound which has a capability of transporting electrons, an excellent electron injection effect with respect to the above-mentioned organic luminescent material, and a capability of forming a thin film is mentioned.

Although the construction material of the electron transport layer is not specifically limited, for example, oxadiale derivatives PBD (2-(4-biphenylyl)-5-(4-tert-butylphenyl)-1, 3,4-oxadiazole), 1-2-4 triazole derivatives TAZ, OXD, $Alq_3$, TPOB, BND (2,5-Bis(1-naphthyl)-1,3,4-oxadiazole), Bath, zinc benzotriazole complex Zn(BTZ), silole derivatives, an electron transport material of oxadiazole system, and an electron transport material having a starburst structure are mentioned.

On each layer of the hole transport layer, the organic luminescent layer, and the electron transport layer in the organic material layer, it is possible to mix more than two types of hole transport materials, the organic luminescent materials, and the electron transport materials into identical layers so that holes or electrons are effectively injected from electrodes into the layers and transported inside the layers. Further, it is possible to sensitize by adding an electron accepting material into the hole transport layer and an electron releasing material into the electron transport layer. Further, each of the hole transport layer, the organic luminescent layer, and the electron transport layer may be formed in a layer structure of more than two layers.

The second electrode 14 is ordinarily a cathode. The material of the second electrode 14 is not specifically limited. In order to effectively inject electrons, the material having a small work function is preferably used. The material of the second electrode 14 is ordinarily a known material used as a cathode of an organic EL, for example, Li, Mg, Al, Ca, LiF, Li—Al, Mg—In, Mg—Ag, and ITO. Further, the second electrode 14 may be formed to have a layer structure of more than two layers if necessary.

A protective layer 15 seals the materials of the organic material layer 13 and the second electrode 14 to prevent mixture of moisture and oxygen into the organic material layer 13 for preventing light emission from the organic material layer 13. Although the material of the protective layer 15 is not specifically limited, a material ordinarily used as a protective layer and a sealing layer of organic EL is used. For example, silicon nitride, silicon oxinitride, and silicon oxide (SiOx) may be used. Further, the protective layer 15 is not limited to a layer made of these inorganic materials and may be in a multitiered structure layer which is formed by laminating an organic material and an inorganic material.

The above described layers are laminated in an order of the transparent substrate 11, the first electrode 12, the organic material layer 13, and the second electrode 14. Thus the organic EL panel 10A shown in FIG. 10 is obtainable. The organic EL panel 10B having the protective layer 15 shown in FIG. 2 forms the protective layer 15 so as to cover the organic material layer 13 and the second electrode 14, respectively of the organic EL panel 10A. Further, as shown in FIG. 1, when the organic EL panel 10A does not have the protective layer 15, the organic layer 13 and the second electrode 14 may be sealed by the sealing can 16.

Each of the layers of the first electrode 12, the organic layer 13 and the second electrode 14 may be formed irrespective of the position of the light emitting portion. For example, the layers may be formed on an entire surface of the transparent substrate other than edges of the transparent substrate 11, or may be formed at a position apart from a drawing electrode (not shown) which is connected to the first electrode 12 and the second electrode 14 on the transparent substrate 11. As such, when each of the layers is formed, the layers can be formed on the entire surfaces thereof. Therefore, the organic EL panels 10A, 10B in a stage before forming the below-described light emitting portion 31 may be easily produced.

In this, "up and down" in this specification represent up and down in a state that the transparent substrate 11 of the organic EL panel 10 is settled downward and the second electrode is settled upward.

The layer thickness of the first electrode 12 and the layer thickness of the second electrode 14 is not specifically limited and can be set up in a range of demonstrating functions of the electrodes. The layer thickness of the organic material layer 13 is not specifically limited and is about 10-1000 nm and preferably about 50-500 nm. The layer thickness of the protective layer 15 is not specifically limited and about 0.1-50 μm, preferably 0.5-5 μm.

Further, the first electrode 12, the organic material layer 13, the second electrode 14, and the protective layer 15 are formed on the transparent substrate 11 by appropriately selecting known various methods of such as printing, coating, CVD, spattering, electron beam, ion-plating and vapor deposition.

Next, a method of forming the light emitting portion 31 in the organic material layer 13 will be described.

In order to form the light emitting portion 31 in the organic material layer 13, according to the Embodiment, the position 32 other than the light emitting portion 31 in the organic material layer 13 is heated by a heating member having a deformable heating portion.

By this heating, it is possible to degenerate an organic material forming the heated position 32 other than the light emitting portion 31. As a result, the light emitting efficiency of the position 32 other than the light emitting portion 31 is extremely lowered, and a pattern where only the light emitting portion 31 emits light when the organic EL panel is used. Further, since the shape of the heating portion of the heating member can be degenerated, it is possible to easily change the light emission pattern of the organic material layer, and therefore a labor and a cost for changing the light emission pattern can be reduced.

Specifically, the heating member is a printing device having a thermal head. The thermal head is a member for heating a portion to be printed. As a printing device having the thermal head, a printing device which can print on a thermal paper or the like is ordinarily used. Further, the heating member is what can be held (gripped) while generating heat from at least one end such as a thermal pen and a soldering bit. The heating member which can be held while generating heat from at least one end is not limited to the thermal pen or the like, and may be a heating member which is in a shape of a writing thing and can apply heat to the organic material by depicting at its end.

Further, because these heating members can apply heat to the organic material 13 in a dot-like shape or a line-like shape, it is possible to obtain minute light emission patterns.

As for the heating member, an example of production method in a case of using a printing device having a thermal head will be described in reference of FIG. 3. As shown in FIG. 3, a personal computer PC and a printer PR are connected so that the personal computer PC outputs information to the printer PR having the thermal head TH.

First, information of the light emitting pattern representing the shape of the light emitting portion 31 is made in use of the personal computer PC. On the other hand, the above-described organic EL panels 10A or 10B without the light emitting pattern of the light emitting portion 31 prepared and set up at a predetermined position of the printer PR. Information of thus made light emitting pattern is outputted from the personal computer PC to the printer PR, the organic EL panels 10A or 10B are carried into the printer PR, and the position 32 other than light emitting portion 31 is heated by the thermal head TH on the basis of the information of the light emitting pattern. The heated positions of the organic EL panels 10A or 10B become the portion 32 which does not emit light. Thus the organic EL panel 10X is produced. Meanwhile, the light emitting pattern is not limited to a checkered pattern shown on the organic EL panel 10X of FIG. 3.

First, the information of the above light emitting pattern can be made in use of various kinds of software having functions of making designs and patterns such as a document production function and a graphic production function. Accordingly, the information of the light emitting pattern can be easily changed and the organic EL panel 10X with its light emitting pattern information changed can be easily produced.

On the other hand, an example of the producing method in the case of using the thermal pen as the heating member will be described in reference of FIG. 4. As shown in FIG. 4, by depicting the position 32 on the organic EL panel 10A or 10B other than the light emitting portion 31 in use of the tip of the heated thermal pen PN, it is possible to obtain the organic EL panel 10X having a desirable light emitting pattern. Even when a soldering bit is used as the heating member, it is possible to obtain the organic EL panel 10X in the similar manner thereto. The light emitting pattern is not limited to the characters of A, B, and C shown in the organic EL panel 10X shown in FIG. 4.

Further, the organic material layer 13 may be heated by a device which can locate a member with its tip end heated like the thermal pen at a predetermined position and automatically depicts the pattern corresponding to the position 32 other than the light emitting portion 31 through the tip end of the heated member on the basis of the outputted light emitting pattern.

Further, it is possible to sell or some such a combination of the heating member such as the heating pen and the soldering bit and the organic EL panel 10A or 10B with no pattern of the light emitting portion 31 formed on it. In use of such combination, it is possible to depict a design and/or a pattern corresponding to the position 31 other than the light emitting portion 31 on the organic EL panel 10A or 10B. Therefore, the design of the light emitting portion 31 is freely determined according to the usage by a purchaser of the combination.

The heating temperature of the organic material layer 13 applied with the heating material will be described.

The heating temperature is set up to be higher than a temperature where optical characteristics of a material are caused to be changed to some extent, for example, the glass-transition temperature of the material having the lowest glass transition temperature among the materials forming the organic material layer 13. By heating to be this temperature, in the heated organic material layer 13, at least the material having the lowest glass transition temperature is degenerated, and the heated portion 32 is changed so as not to easily emit light. Hereinafter, the glass-transition temperature is used only as an example and a temperature where optical characteristics of a material are caused to be changed may be used not only for the materials of the organic material layer 13 but also for a first electrode, a second electrode, the substrate, and a protective layer as long as a light emitting state and a transmittance and so on are changed.

In a case where an organic material of a sublimation type is used, such the temperature where optical characteristics of a material are caused to be changed is, for example, a boiling point(B.P.), a melting point(M.P.) a softening point, and a crystallization point.

Specifically, by changing the heating temperature with the heating material as described above, in a cross-sectional view of the organic EL panel 10X omitting the sealing can 16 or the protective layer 15 in FIG. 15, the positions 32a and 32b, being other than the light emitting portion, can be formed.

First, by heating to be a temperature higher than the lowest glass transition temperature of the material which forms the organic material layer, at least the material having the lowest glass transition temperature is degenerated to thereby form the position 32a other than the light emitting portion 31. The position 32a other than the light emitting portion is degenerated at a portion in a direction of laminating the organic material 13 (the lowest layer in the organic material layer 13 in FIG. 5).

By heating to be the temperature higher than the highest glass transition temperature of the material having the highest glass transition temperature, it is possible to form the position 32b other than the light emitting portion 31 by degenerating all the materials forming the organic material layer 13. In the position 32b other than the light emitting portion, the entirety in the laminating direction of the organic material layer 13 shown in FIG. 5 is degenerated. Further, when the organic material layer 13 is made from only a single material, by heating to be higher than the glass transition temperature of the material, it is possible to form the position 31b where the entirety in the laminating direction of the organic material layer 13 is degenerated in other than the light emitting portion 32 may be formed.

Further, when a plastic material is used as the transparent substrate 11, the heating temperature with the heating member is set up to be lower than the glass transition temperature of thus used plastic material. By heating to be such the temperature, it is possible to form a predetermined light emitting portion 31 without degenerating the surface and the inside of the transparent substrate 11.

In this, a procedure of heating the organic material layer 13 will be described.

As shown in FIGS. 1 and 2, the heat is ordinarily applied to the organic material layer from the side of the transparent substrate 11 of the organic EL panels 10A and 10B, where the pattern of the light emitting portion 31 is formed, in use of the heating member. When any one of the first electrode 12, the organic material layer 13, and the second electrode 14 is made from a material which does not have a sufficient mechanical and/or heat resistant strength, if the heating member is applied so as to be in a direct contact with the first electrode 12, the organic material layer 13, or the second electrode 14, the first electrode 12, the organic material layer 13, or the second electrode 14 are easily deteriorated.

By heating from the side of the transparent substrate 11 having a certain strength, it is possible to form the light emitting portion 31 without deteriorating the first electrode 12, the organic material layer 13, and the second electrode 14.

When any one of the first electrode 12, the organic material layer 13, and the second electrode 14 is made from a material which does not have a sufficient mechanical and/or heat resistant strength, if the heating member is applied so as to be in a direct contact with the first electrode 12, the organic material layer 13, or the second electrode 14, the first electrode 12, the organic material layer 13, or the second electrode 14 are easily deteriorated. As shown in FIG. 2, when the protective layer 15 having a certain strength is formed on the organic EL panel 10B, it is possible to heat from the side of the protective layer 15 of the organic material layer 13 in use of the heating member. Namely, when the organic EL panel 10B has the protective layer 15, it is possible to form the light emitting portion 31 without deteriorating the first electrode 12, the organic material layer 13, and the second electrode 14 even the organic material layer 13 is heated from the side of the protective layer 15.

The organic EL panel 10X, which is manufactured in accordance with the above described production method, is formed by laminating the first electrode 12, the organic layer 13 and the second electrode 14 on the transparent substrate 11 as the substrate. The organic EL panel 10X is heated at the position 32 other than the light emitting portion 31 on the organic material layer with the heating member having the heating portion in the deformable shape.

The organic EL panel 10X selectively emits light from the light emitting portion 31 in accordance with the predetermined design and the pattern, and may be adapted to various usages such as a poster, an advertising display, an advertising tower, and a name card.

The organic EL panel 10X thus produced may be a panel of so-called bottom emission type, which emits light from the side of the transparent substrate 11 using the transparent substrate 11 as described. Further, it is possible to make the organic EL panel 10X thus produced a panel of so-called top emission type, which emits light from the side of the second electrode 14. It is possible to appropriately change the materials, the layer thicknesses, and so on of the substrate, the first electrode, the second electrode, the protective layer, and so on depending on whether the organic EL panel is the top emission type or the bottom emission type.

As described, the method of producing the organic EL panel is the method of sequentially laminating the first electrode 12, the organic material layer 13, and the second electrode 14 to selectively provide the light emitting portions 31 being the portions emitting light on the organic material layer 13, wherein the position 32 other than the light emitting portions 31 on the organic material layer 13 is heated by the heating member having the deformable heating portion.

Accordingly, by heating the position 32 other than the light emitting portion 31 of the organic EL panel 10X, it is possible to degenerate an organic material which forms the heated position 32 other than the light emitting portion 31. As a result, the light emission efficiency of the position 32 other than the light emitting portion 31 is extremely deteriorated. Thus the organic EL panel 10X which emits light only at the position of the light emitting portion 31 is used when the organic EL panel 10X is used.

Further, by deforming the shape of the position where the heating member is heated, it is possible to easily change the pattern of the light emitting portion 31 of the organic material layer 13. When the emitting pattern is changed, it is possible to reduce the labor and the cost when the emitting pattern is changed.

In the method of producing the organic EL panel according to the present invention, it is characterized in that the printer PR having the thermal head TH is used as the heating member.

Accordingly, by printing (heating) the position 32 other than the light emitting portion 31 using the printer PR having the thermal head TH, it is possible to obtain the organic EL panel 10X, which selectively emits light from only the light emitting portion 31, is obtainable. Further, since it is possible to make and appropriately change information representing the position of the light emitting portion 31 to be output to the printer PR having the thermal head TH, the organic EL panel 10X with its emitting pattern easily changed is easily provided.

In the production method of the organic EL panel according to the embodiment, the heating member, which generates heat at its one end and can be held, is used.

Accordingly, as the heating member which generates heat at its one end and can be held, for example a member in a shape of writing material, which generates heat at its tip end such as so-called thermal pen PN and soldering bit, may be used to heat the position other than the light emitting portion 31 in order to obtain the organic EL panel 10X which selectively emits light only from the light emitting position 31. Further, in use of the thermal pen PN and the soldering bit, it is possible to freely change the position of the light emitting portion 31 for heating the organic material layer 13 of the position 32 other than the light emitting portion 31. Thus the organic EL panel 10X having an arbitrary emitting pattern is obtainable.

The production method of the organic EL panel according to the embodiment has characteristics such that the first electrode 12, the organic material layer 13, and the second electrode 14 are formed irrespective of the position of the light emitting position 31.

Accordingly, it is possible to form, for example, the first electrode 12, the organic material layer 13, and the second electrode 14 on an entire surface of the transparent substrate 11 except for the edges thereof, without patterning each of the layers. Accordingly, it is unnecessary to provide a process such as a photolithography for patterning each of the layers of the first electrode 12, the organic material layer 13, and the second electrode 14 as in the conventional technique. Therefore, the production process of the organic EL panel becomes easy.

In the production method of the organic EL panel according to the embodiment, it is characterized in that the heating member applies heat higher than the glass-transition temperature of the material having the glass transition temperature of the material having the lowest glass transition temperature which forms the organic material layer 13.

Accordingly, since the organic material layer 13 is heated to be a temperature higher than the glass-transition temperature of the material having the glass transition temperature of the material having the lowest glass transition temperature which forms the organic material layer 13, at least the material having the lowest glass transition temperature in the heated organic material layer 13 is degenerated. Therefore, the heated portions 32a and 32b do not emit light. Therefore, it is possible to provide the organic EL panel 10X which emits light only at a predetermined light emitting portion 31 can be provided.

The production method of the organic EL panel according to the embodiment is characterized in that the heating member heats a plastic material, which is used as the substrate 1, to be a temperature lower than the glass transition temperature of the plastic material.

Accordingly, since the organic material layer 13 is heated to be the temperature lower than the glass transition temperature of the plastic material, it is possible to provide the organic EL panel 10X which emits light only at the predetermined light emitting portion 31 without degenerating the heated transparent substrate 11.

In the production method of the organic EL panel according to the Embodiment, there is a characteristic that the organic material layer 13 is heated from the side of the substrate 11 of the organic material layer 13.

Accordingly, without deteriorating the first electrode 12, the organic material layer 13 and the second electrode 14, it is possible to provide the organic EL panel 10X which emits light only at the predetermined light emitting portion 31.

The production method of the organic EL panel according to the present embodiment, when a protective layer 15 is formed to cover the organic material layer 13 and the second electrode 14, has a characteristic that heat is applied from the side of the protective layer of the organic material layer 13.

Accordingly, since the protective layer 15 is formed on the organic EL panel 10X, even when it is heated from any side of the transparent substrate 11 and the protective layer 15, it is possible to provide the organic EL panel 10X which emits light only at its predetermined portion 31 without deteriorating the first electrode 12, the organic material layer 13, and the second electrode 14.

The above described organic EL panel 10X, which is formed by laminating the first electrode 12, the organic material layer 13, and the second electrode 4 on the transparent substrate 11, and selectively provided with the light emitting portion 31 which emits light in the organic material layer 13, has a characteristic that the position 32 other than the light emitting portion 31 is heated by the heating member which is deformable in its heating portion.

Accordingly, by heating the position 32 other than the light emitting portion 31 of the organic EL panel 10X, it is possible to degenerate the organic material which constitutes the heated position 32 other than the heating portion 31. As a result, the light emitting efficiency of the position 32 other than the light emitting portion 31 is extremely lowered. When the organic EL panel is used, it is possible to provide the organic EL panel 10X which emits light only at the light emitting portion 31.

Further, by deforming the shape of the portion which is heated by the heating portion of the heating member, it is possible to easily change the pattern of the light emitting portion 31 of the organic material layer 13. Therefore, it is possible to obtain the organic EL panel 10X with its working labor and cost reduced when the light emitting pattern is to be changed.

The present invention is not confined to the configurations listed in the foregoing embodiments, but it is easily understood that the person skilled in the art can modify such configurations into various other modes, within the scope of the present invention described in the claims.

The entire disclosures of Japanese Patent Applications No. 2004-279678 filed on Sep. 27, 2004 including the specification, claims, drawings and summary are incorporated herein by reference in its entirety.

What is claimed is:

1. A method of producing an organic EL panel which is obtained by sequentially laminating a first electrode, an organic material layer, and a second electrode on a substrate and selectively providing a light emitting portion, being a portion of emitting light, in the organic material layer comprising steps of:

heating the organic material layer at a position other than the light emitting portion with a heating member having a deformable heating portion to change an optical characteristic of the position.

2. A method of producing an organic EL panel according to claim 1, wherein the heating member is a printer having a thermal head.

3. A method of producing an organic EL panel according to claim 1, wherein the heating member has at least a tip end which emits heat and can be gripped.

4. A method of producing an organic EL panel according to claim 1, wherein the first electrode, the organic electrode, and the second electrode are formed irrespective of the position of the light emitting portion.

5. A method of producing an organic EL panel according to claim 1, wherein the heating member applies heat having a temperature higher than a temperature of changing an optical characteristic of the material having the lowest temperature of changing an optical characteristic among materials which forms the organic material layer.

6. A method of producing an organic EL panel according to claim 1, wherein the heating member heats the substrate to be lower than a temperature of changing an optical characteristic of the substrate.

7. A method of producing an organic EL panel according to claim 6, wherein heat is applied from a side of the substrate of the organic material layer.

8. A method of producing an organic EL panel according to claim 1, further comprising steps of: forming a protective layer which covers at least the organic material layer and the first or second layer; and heating on a side of the protective layer of the organic material layer.

* * * * *